United States Patent
Schie (10) Patent No.: US 6,771,679 B2
(45) Date of Patent: Aug. 3, 2004

(54) APPARATUS AND METHOD FOR PROGRAMMABLE CONTROL OF LASER DIODE MODULATION AND OPERATING POINT

(76) Inventor: David Chalmers Schie, 22620 Ricardo Rd., Cupertino, CA (US) 95014

(*) Notice: Subject to any disclaimer, the term of this patent is extended or adjusted under 35 U.S.C. 154(b) by 34 days.

(21) Appl. No.: 09/859,570

(22) Filed: May 16, 2001

(65) Prior Publication Data

US 2001/0046243 A1 Nov. 29, 2001

Related U.S. Application Data

(60) Provisional application No. 60/204,316, filed on May 17, 2000.

(51) Int. Cl.⁷ .................................................. H01S 3/00
(52) U.S. Cl. ................. 372/38.1; 372/38.01; 372/38.02
(58) Field of Search ........................... 372/38.1, 38.01, 372/38.02, 20, 26, 32; 359/118

(56) References Cited

U.S. PATENT DOCUMENTS

| | | | | |
|---|---|---|---|---|
| 4,709,416 A | * | 11/1987 | Patterson | 359/118 |
| 5,019,769 A | | 5/1991 | Levinson | |
| 5,491,329 A | * | 2/1996 | Urakami et al. | 250/205 |
| 5,638,390 A | | 6/1997 | Gilliland et al. | |
| 5,812,572 A | * | 9/1998 | King et al. | 372/26 |
| 6,011,768 A | * | 1/2000 | Taguchi | 369/116 |
| 6,034,446 A | * | 3/2000 | Kowalski et al. | 307/112 |
| 6,195,370 B1 | * | 2/2001 | Haneda et al. | 372/29.01 |
| 6,195,371 B1 | * | 2/2001 | Haneda et al. | 372/29.01 |
| 6,222,861 B1 | * | 4/2001 | Kuo et al. | 372/20 |
| 6,310,518 B1 | * | 10/2001 | Swanson | 330/282 |
| 6,345,062 B1 | * | 2/2002 | Taguchi et al. | 372/38.01 |
| 6,359,918 B1 | * | 3/2002 | Bielas | 372/38.01 |
| 2002/0057721 A1 | * | 5/2002 | Taguchi et al. | 372/32 |

* cited by examiner

Primary Examiner—Paul Ip
Assistant Examiner—Hung T Vy
(74) Attorney, Agent, or Firm—Andrew M. Harris; Weiss, Moy & Harris, P.C.

(57) ABSTRACT

An apparatus and method for programmable control of laser diode modulation and operating point provides control for laser diodes having widely varying characteristics, such as laser diodes from a variety of manufacturers. Operating a wide variety of lasers is useful for implementation of a device independent integrated circuit for control of a laser diode. Laser diode maximum AC drive levels, AC input circuit response and DC operating point are programmed via a programmable storage coupled via control circuits to a drive amplifier and a bias circuit. The laser diode modulation control may be combined with laser diode bias control in a single integrated circuit, providing a single-chip solution for laser diode transceiver module manufacturers. The programmable storage may be one-time programmable for factory customization of laser diode transceiver module diodes, or may be an electrically alterable storage.

33 Claims, 6 Drawing Sheets

APPARATUS AND METHOD FOR PROGRAMMABLE CONTROL OF LASER DIODE MODULATION AND OPERATING POINT

RELATED APPLICATIONS

This application is related to U.S. provisional application No. 60/204,316 filed May 17, 2000 and from which it claims benefits under 35 U.S.C. §119(e).

BACKGROUND OF THE INVENTION

1. Field of the Invention

The present invention relates generally to semiconductor laser control, and more specifically to an apparatus and method for programmable control of laser diode modulation and operating point.

2. Background of the Invention

Laser diodes and laser diode modules are increasingly used in computer and telecommunications networks, due to their low cost and wide bandwidth potential. In particular, laser diodes are used in applications such as Dense Wave Division Multiplexing (DWDM) systems. DWDM systems use laser diode outputs at multiple wavelengths. The outputs are combined and introduced into a single optical fiber to achieve data rates higher than possible with an optical connection with a single source and detector.

In order to manufacture optical transceivers at low cost and high volumes, it is desirable to produce a complete integrated circuit solution for controlling a laser diode for use in constructing a complete transceiver circuit. A complete integrated solution has not been practical, due to the variations between individual laser diodes from a single manufacturer and differences between laser diode designs from different manufacturers. Additionally, laser diodes in common use include a monitor photodiode optically coupled to the laser diode. The optical coupling of the monitor diode to the laser diode is also variable, compounding the difficulties of manufacturing a complete integrated circuit solution.

The efficiency of the laser diode and the operating point and transition times of the laser diodes vary widely, causing systems manufacturers to incorporate tuning circuits in their systems that must be adjusted after assembly of the control circuit and the laser. The resources required to tune each of the laser diode assemblies increases the cost of production and reduces the volume of components that may be produced.

Circuits incorporating electrical alterable memories have been implemented that control the bias current of the laser diode, but this is not a complete solution to the problem. Due to the variations in efficiency between laser diodes and variations in transition time for the signals transmitted by the system must be compensated via tuning.

Additionally, due to the wide variations in efficiency, a circuit designed for a low efficiency laser diode may drive a high efficiency diode at too high an AC amplitude, causing the high efficiency diode to fall out of lasing mode and entering the light-emitting diode (LED) region of operation. If the A/C modulating signal amplitude is so high as to cause the laser diode to leave the lasing mode, data communications will be completely disrupted, as the data signal is a high-frequency intensity modulation superimposed on the operating point intensity of the laser. When the laser diode falls into LED mode, the intensity drops dramatically. The loss in intensity will cause a detector that is detecting the modulation to experience a total loss of signal.

Finally, operation of the laser diode must be controlled in a manner that is stable over temperature variations, has startup characteristics that will not damage the laser diode, and will not harm personnel that may be exposed to the light emitted from the laser diode. IEEE standard 802.3 sets forth guidelines for operation of laser diode communications modules and limits on output intensity for safety of personnel.

Therefore, it would be desirable to provide a method and apparatus for programmable control of laser diode modulation swing and transition time as well as laser diode operating point to accommodate a wide variety of laser diodes from various manufacturers using a single integrated circuit component design. It would further be desirable to provide a method and apparatus that control laser diode operating point that is temperature compensated and limits the minimum and maximum output of the laser diode.

SUMMARY OF THE INVENTION

The above objective of programmably controlling laser diode modulation and operating point are achieved in an apparatus and method. The apparatus and method may set a limit control on an amplifier in the modulation signal path as well as a coupling capacitance that affects the transition times of the modulation signal as applied to the laser diode. The limit control and coupling capacitance are set by values retrieved from a memory. Additionally, a bias circuit providing a precision voltage reference and thermal compensation may be employed to provide stable control of laser diode operating point. The voltage reference may be controlled by an under-voltage lockout circuit and power-on reset circuit and supplied to an external pin of an integrated circuit in order to provide reference and control functions from a single external pin.

The foregoing and other objectives, features, and advantages of the invention will be apparent from the following, more particular, description of the preferred embodiment of the invention, as illustrated in the accompanying drawings.

DETAILED DESCRIPTION OF THE PREFERRED EMBODIMENTS

Figure 1:
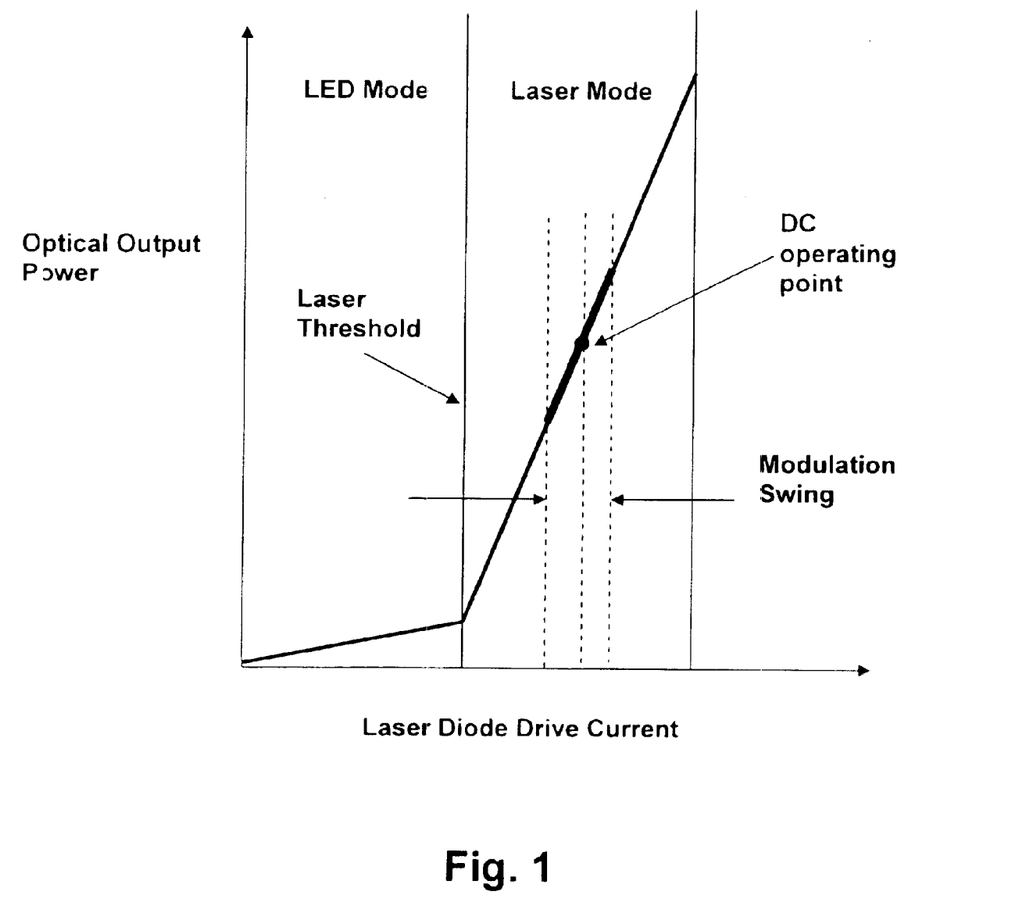
FIG. 1 is a graph depicting operational characteristics of a laser diode drive circuit in accordance with a preferred embodiment of the invention.

With reference now to the Figures, and in particular with reference to FIG. 1, operational characteristics in accordance with a preferred embodiment of the invention are depicted. A laser diode produces an optical output in response to a drive current that is passed through the laser diode. As depicted in FIG. 1, there are two regions of operation that are of interest: LED mode and Laser Mode. At current levels below the laser threshold, the optical output of the laser diode is low, similar to a light-emitting diode (LED). Above the laser threshold current, the laser diode begins to lase, producing substantially greater optical output power as the laser diode drive current is increased up to the maximum operating current of the laser diode.

The drive circuit of the present invention is adapted to provide a DC operating point and a modulation swing such that the minimum level of drive current passed through a laser diode is above the laser threshold and the maximum laser output is below a maximum level of brightness. Laser diodes available from various manufacturers have different characteristics. The laser threshold differs, as well as the maximum operating current. In order to manufacture a single integrated circuit solution, the DC operating point and modulation signal swing must be carefully controlled so that the minimum value of the laser diode drive current does not drop below the laser threshold and the maximum value of laser diode drive current does not exceed the maximum operating current. The rate of change of optical output power with respect to laser diode drive current also differs for different manufacturer's laser diode, making it necessary to adjust the modulation swing to accomplish a given modulation index. Laser intensity levels for binary modulation signals producing a digital "1" and "0" representation corresponding to maximum and minimum brightness levels are set by industry standards such as IEEE 802.3, promulgated by the Institute of Electrical and Electronics Engineers (IEEE). Rise and fall times of the modulation signal must also be controlled in accordance with industry standards.

Additionally, laser diodes from the same manufacturer may have substantial variations from device to device and with ambient temperature of the laser diode. Therefore, a mechanism for controlling the DC operating point and modulation swing must be integrated within a controller that is flexible enough to interface a variety of laser diodes under all conditions. Since operating limits for the laser must be maintained both for the protection of the laser, and to ensure that personnel are not exposed to laser light above a predetermined intensity, mechanisms that control the DC operating point to set a maximum intensity and to control the intensity under abnormal operating conditions are necessary within an integrated circuit controller that will operate across the variation of laser diodes supported.

Figure 2:
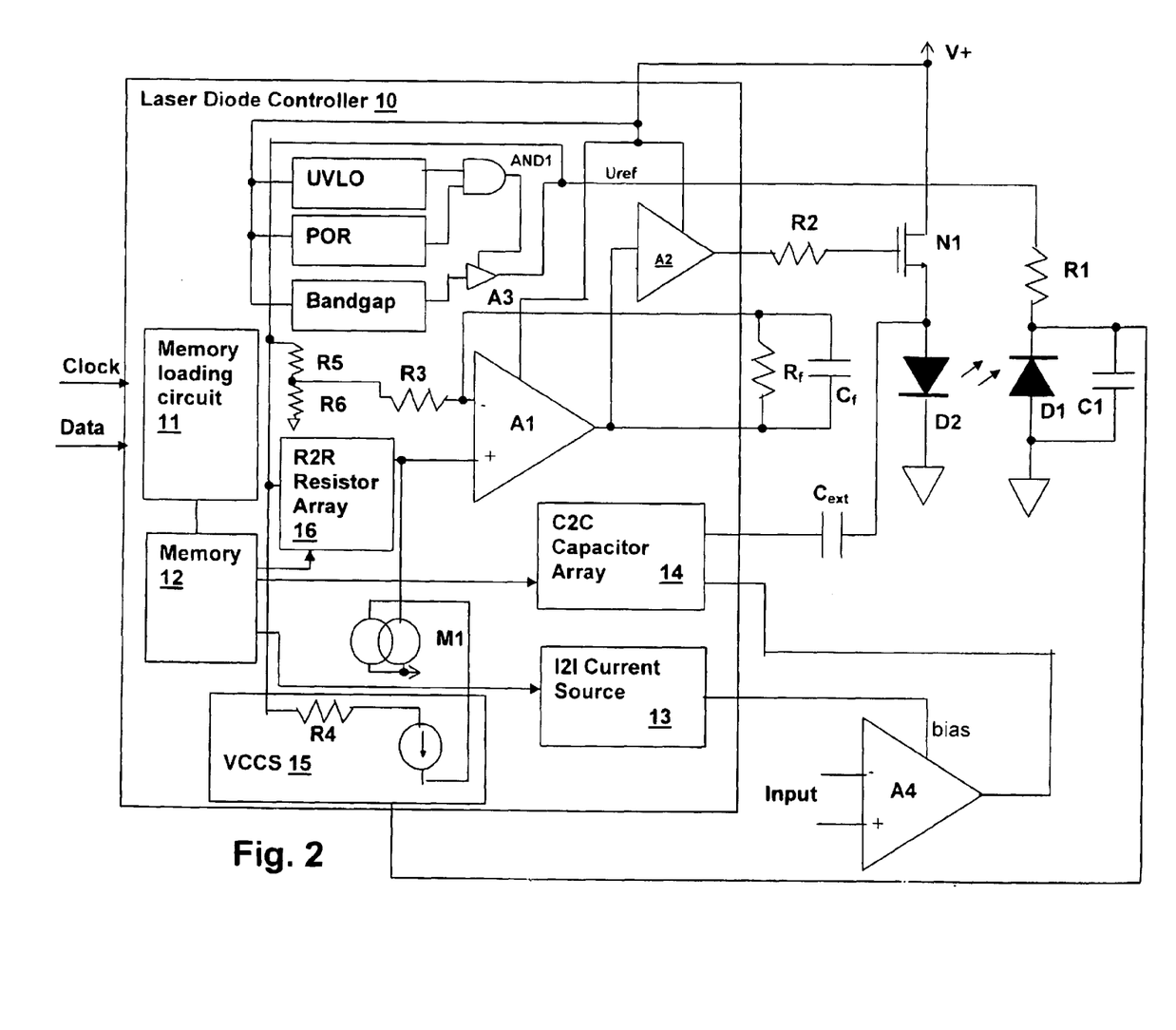
FIG. 2 is a schematic diagram depicting an integrated circuit coupled to a laser diode in accordance with a preferred embodiment of the present invention.

Referring now to FIG. 2, an integrated circuit 10 coupled to a laser diode D2 in accordance with a preferred embodiment of the invention is depicted. Laser diode D2 is optically coupled to a monitor diode D1, which provides an output that is proportional to the intensity output of laser diode D2, thereby providing a laser intensity detector. A feedback mechanism comprising voltage controlled current source (VCCS) 15, current mirror M1, resistor array 16, amplifier A1, buffer A2, and control transistor N1 (that is coupled to amplifier A1 by resistor R2) uses the output of monitor diode D1 to generate a controlled bias current through laser diode D2. Capacitor C1 is low ESR capacitor for shunting the high-frequency modulation signal from monitor diode D1.

Monitor diode D1 is biased through resistor R1 by a voltage reference output Uref that is also common to circuits within laser diode controller 10. This permits rejection of power supply noise and ripple voltage variations to which typical laser diode controllers are susceptible. The reference output pin supplying the monitor diode bias voltage may be used for other purposes outside an integrated circuit implementing laser diode controller 10, such as determining comparator thresholds for such circuits are laser intensity detectors, etc. Resistor R1 can be a low temperature coefficient type, permitting a stable bias current and can be used to scale the feedback loop that controls laser diode D2 operating point, since voltage across resistor R1 produced by the monitor diode bias current will control the amplitude of the feedback signal to laser diode controller 10. Generally, resistor R1 should be chosen to have no temperature variation or as little temperature variation as possible, so that the circuits internal to laser diode controller 10 may be designed to have no temperature variation.

Voltage controlled current source (VCCS) 15, detects the voltage across resistor R1 and converts it to a current that is coupled to current mirror M1. Current mirror M1 then generates a current proportional to the monitor diode D2 voltage, drawing the current through R2R resistor array 16. The feedback loop is thermally stable, as resistor R4 within VCCS 15 determines the current through R2R resistor array 16. In the preferred embodiment, resistor R4 is an hpoly or $P^+$ resistor fabricated in the same sea of resistors as the hpoly or $P^+$ resistors within R2R resistor array 16. Therefore error due to temperature variation of resistor R4 and R2R resistor array 16 is cancelled. Use of a current loop also improves the power supply rejection ratio (PSRR) of the feedback loop and temperature compensates the loop through matching variation in resistor R4 and variations in R2R resistor array 16, as does using the Uref signal as a reference rather than a power supply rail.

Amplifier A1 is an operational amplifier that will amplify the difference voltage developed by R2R resistor array 16 produced by current mirror M1. The inverting input of amplifier A1 is coupled to a reference divider formed by resistors R5 and R6 via a resistor R3. Resistors R3, R5 R6 and $R_f$ can be matched so as to cancel thermal variation. The output of amplifier A1 is buffered by a unity gain buffer A2 that biases transistor N1 to control current through laser diode D2. The gain and characteristic response of the laser diode bias feedback loop can be adjusted by external resistor $R_f$ and external capacitor $C_f$. Resistor $R_f$ is optional and may be removed entirely, yielding an integrator. Without resistor $R_f$ operation of the loop will be that of a proportional-integral (PI-control) controller. Otherwise, with resistor $R_f$ included and optional capacitor $C_f$ omitted, the loop forms a proportional controller (P-control).

Factory programming of the bias circuit is achieved through a memory 12 that is coupled to R2R resistor array 16. The resistance value of R2R resistor array 16 determines the bias voltage and is set by loading data from memory 12 into a shift register in R2R resistor array 16. A memory loading circuit 11 receives an external data and clock signal for loading values to control R2R resistor array 16 as well as C2C capacitor array 14 and I2I current source 13. A decoder may be provided within memory loading circuit 11 that separates a data signal from a clock signal, thus providing a one-wire data loading input that does not require a separate clock signal. The memory loading circuit 11 may also include level-shifting inputs on the data and clock inputs and a location in memory 12 may be used to select the input signal levels. In this manner, an interface to (emitter coupled logic) ECL or (Transistor-Transistor Logic) TTL may be supported without external circuitry. Once the selection is made by programming memory 12 using default level signals, subsequent interfaces may be made at another logic level, permitting factory customization of the logic levels supported. If fault logic and other logic circuits have outputs provided from laser diode controller 10, the logic outputs may be level adjusted to conform to the level selection stored within programmable memory 12.

The values in memory 12 are generally factory programmed by the laser diode/controller system integrator (e.g., the manufacturer of a transceiver) in order to tune each laser diode D2 to each laser diode controller 10. Memory 12 is generally a one-time-programmable memory (OTP), but may be an electrically erasable memory (EEPROM), or a volatile memory loaded from another storage means or algorithm. An OTP memory 12 is generally preferable, as OTP memories are more reliable than electrically erasable memories and failure of the memory value may cause unsafe operation of laser diode D2.

Alternatively, an analog electrically erasable memory (analog $E^2$) may replace memory 12 and R2R resistor array 16, permitting a stored voltage to directly control amplifier A1 to produce a stored laser diode bias value. In this alternative embodiment, the output of the analog $E^2$ memory is coupled to a is mosfet and the voltage set to bias the mosfet in the triode region, thus producing a variable resistor that replaces R2R resistor array 16.

Operation of the laser diode bias circuit is further controlled by an under-voltage lockout circuit UVLO and a power-on reset circuit POR. Bandgap reference provides a stable output reference voltage for operation of the laser diode controller 10. The bandgap is coupled to the power supply input of the laser diode controller 10 and derives an output free of power supply variation and noise. The output of the bandgap is buffered by buffer amplifier A3 and supplied to an external pin that is used to bias monitor diode D1, providing performance superior to prior designs that do not supply a dedicated voltage reference to bias the monitor diode. The prior designs are susceptible to power supply variations and noise and typically use the same power supply that is used to power the bias control circuit. Additionally, the buffered reference output is useful for deriving external references, such as thresholds of comparators that provide external safety measurements.

When the input voltage to the laser diode controller 10 is insufficient for operation, AND gate AND1 will have a logic low output, disabling buffer amplifier A3 and removing the Uref reference signal from the internal bias circuit. This action will disable amplifiers A2 and A3, turning off transistor N1, which in turn deactivates laser diode D2. An additional breaker circuit may be added to amplifier A1 to completely clamp its output when the Uref signal is disabled by buffer A3 or the logic enable signal may be used to control a clamp coupled to amplifier A1. Similarly, during initialization of laser diode controller 10, power-on reset circuit POR will disable buffer amplifier A3 via AND gate AND1. Since the Uref signal is output from laser diode controller 10, external circuitry requiring a power-on reset and undervoltage lockout can use the Uref signal to condition operation, eliminating the need for an external circuit to provide these functions. The Uref signal combines a reference, power-on reset information and UVLO information in one external pin, making this information available to external circuitry using a minimum of connections.

Control of the modulation swing of laser diode D2 and control of the rise and fall times of the modulated levels of laser diode D2 drive current are also provided by laser diode controller 10. An amplifier A4 couples a differential modulation signal input to laser diode D2 via an optional external capacitor $C_{ext}$ and an internal C2C capacitor array 14. C2C capacitor array permits tuning of the coupling capacitance to laser diode D2 by values loaded from memory 12, which are generally factory programmed. Thus, control of transition time (rise and fall time) of the modulation applied to laser diode D2 is accomplished by laser diode controller 10.

Control of laser diode D2 modulation swing is accomplished by setting the maximum amplitude swing of the output of amplifier A4, which is generally a high frequency Gas (Gallium Arsenide) amplifier. Amplifier A4 is generally an amplifier having a current output, but the output of amplifier A4 may be a voltage, which is then converted to a current. Since the modulation input may contain information having a frequency higher than 1 Ghz, amplifier A4 generally will not be integrated within integrated circuit controller 10.

The control of the output levels produced by amplifier A4 is made via a bias input. I2I current source 13 controls the bias level and is coupled to memory 12, whereby values are loaded to control the maximum amplitude of amplifier A4 and thereby the modulation swing applied to laser diode D2. Since the maximum current output of amplifier A4 is symmetrical and bipolar, the minimum laser diode current is the quiescent operating current of diode D2 as set by the bias control circuit minus the maximum current output of amplifier A4. The maximum laser diode current is the quiescent operating current plus the maximum current output of amplifier A4. Alternatively, the output of amplifier A4 may be a unipolar current, or be asymmetrical with respect to a zero output current, but the same principles apply. For example, the output of amplifier A4 may range from zero current to a positive DC current. In this case, the quiescent current of laser diode D2 will be the current output from the bias control circuit plus half of the maximum current output of amplifier A4. The illustration described above is for an amplifier A4 that has a current control input. For an amplifier having a voltage control input, the I2I current source 13 output can be converted to a voltage.

Alternatively, an analog electrically erasable memory (analog $E^2$) may replace memory 12 and I2I current source 13, permitting a stored voltage to control the modulation swing of amplifier A4. In this alternative embodiment, the output of the analog $E^2$ memory is coupled to a VCCS and the current output used to bias the control input of amplifier A4. If analog $E^2$ is used to set bias and modulation swing for the laser diode, memory 12 should still include digital memory for the control of C2C capacitor array if it is included within an IC laser diode controller.

Figure 3:
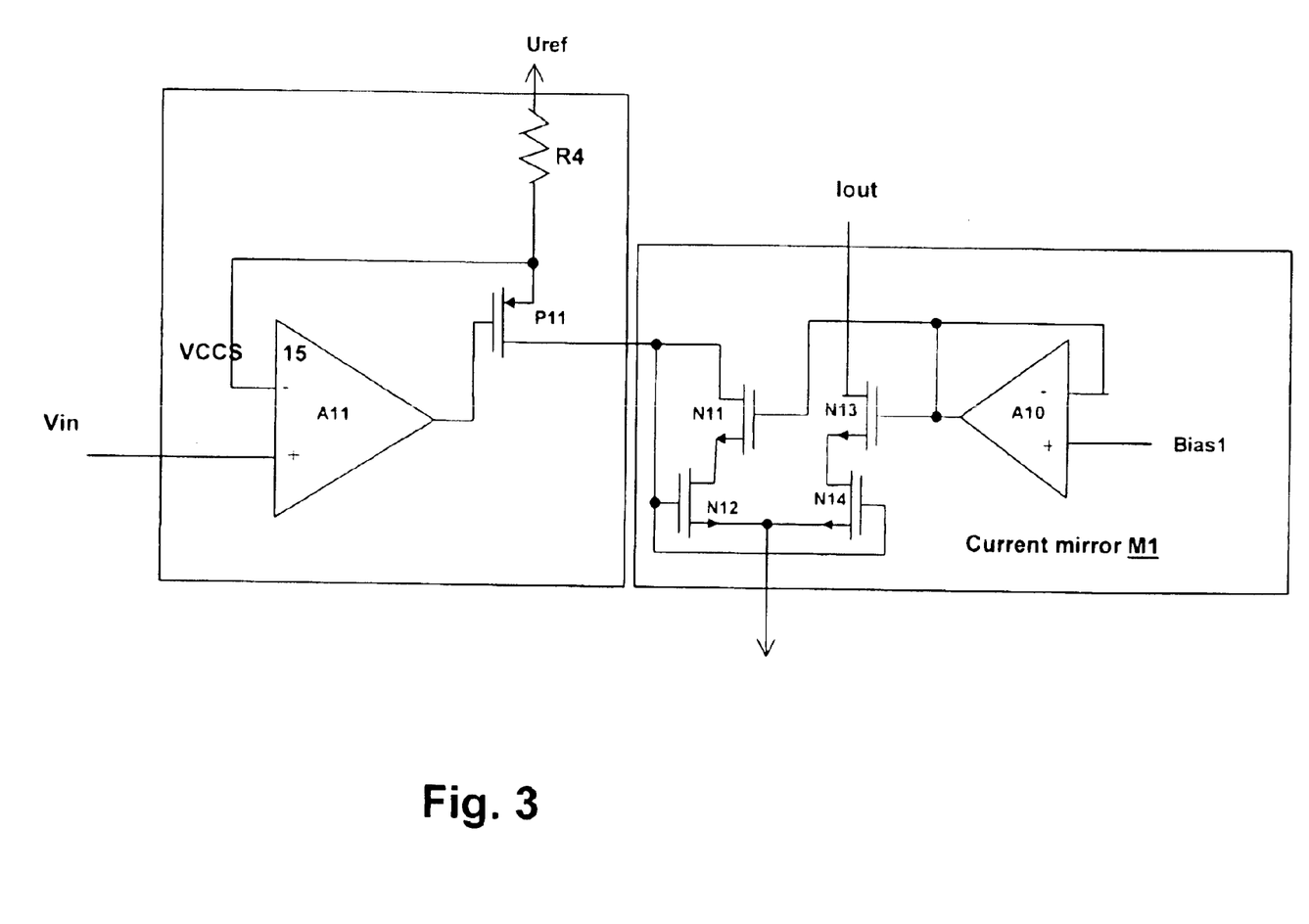
FIG. 3 is a schematic diagram depicting features of the bias control circuit of FIG. 1.

Referring now to FIG. 3, features of the bias circuit of FIG. 2 are depicted. VCCS 15 includes an amplifier A11 coupled to a p-channel transistor P11 to produce a current output that is proportional to the voltage across monitor diode D1 of FIG. 2. Resistor R4 is also included within VCCS 15 and is further coupled to reference voltage Uref, so that the temperature variation of resistor R4 will cause a corresponding variation in the current through transistor P11. (This variation will in turn be cancelled by a corresponding variation in the voltage produced across R2R resistor array 16 of FIG. 2). The current drawn through transistor P11 is coupled to current mirror M1.

Current mirror M1 is an N-channel cascoded supercurrent mirror that maximizes the matching between transistors on a common die. (A bipolar or folded current mirror could also be used.) Transistors N12 and N14 form the mirror pair and have gates coupled to the input terminal of current mirror M1. The current introduced into current mirror M1 is coupled through the channel of transistor N12 via transistor N11, which is biased by amplifier A10 according to standard cascode techniques. A transistor N13 that is matched to transistor N11, couples the mirrored current through transistor N14 to current output Iout. While transistors N11 and N13 are depicted as field-effect transistors, bipolar transistor current mirror transistors and cascodes may also be used.

Figure 4:
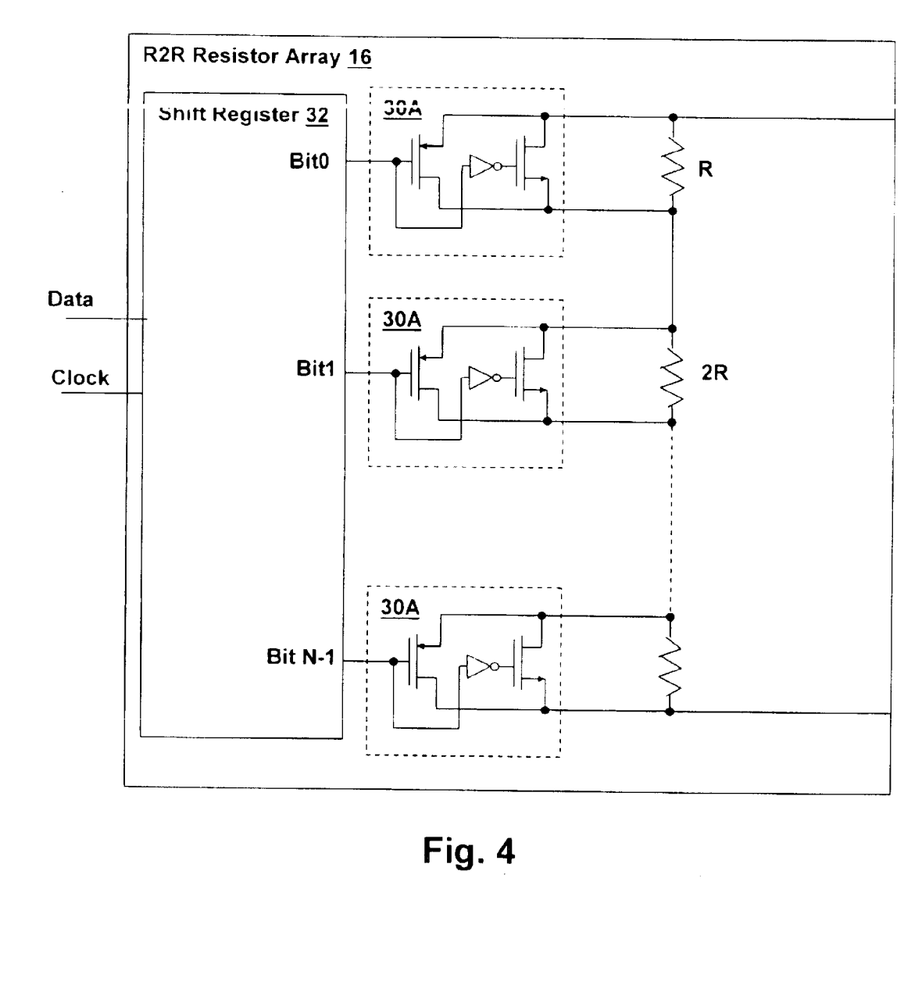
FIG. 4 is a schematic diagram depicting the R2R resistor array 16 of FIG. 2.

Referring now to FIG. 4, details of R2R resistor array 16 of FIG. 2 are depicted. A shift register 32 receives a data and a clock signal whereby values may be loaded from memory 12 of FIG. 1. Individual bits clocked into shift register 32 control transmission gates 30A–30C to short out resistors corresponding to values not needed to form the programmed resistance value. Since the resistors are arranged in a power-of-two sequence within the resistive ladder within R2R resistor array 16, any value may be programmed up to $R''(2^{(N+1)}-1)$, yielding N bits of resistance resolution. The dashed line connecting resistors within R2R resistor array depict that the number of resistors used in a controller integrated circuit design may be determined by the resolution required for operation of the bias circuit for the range of laser drive parameters required. Additionally, the resistance values within resistor array 16 may be chosen in increments other than powers-of-two, for example, a greater resolution may be around the lower end of the resistance scale by including more precision near the least significant bit (LSB).

Figure 5:
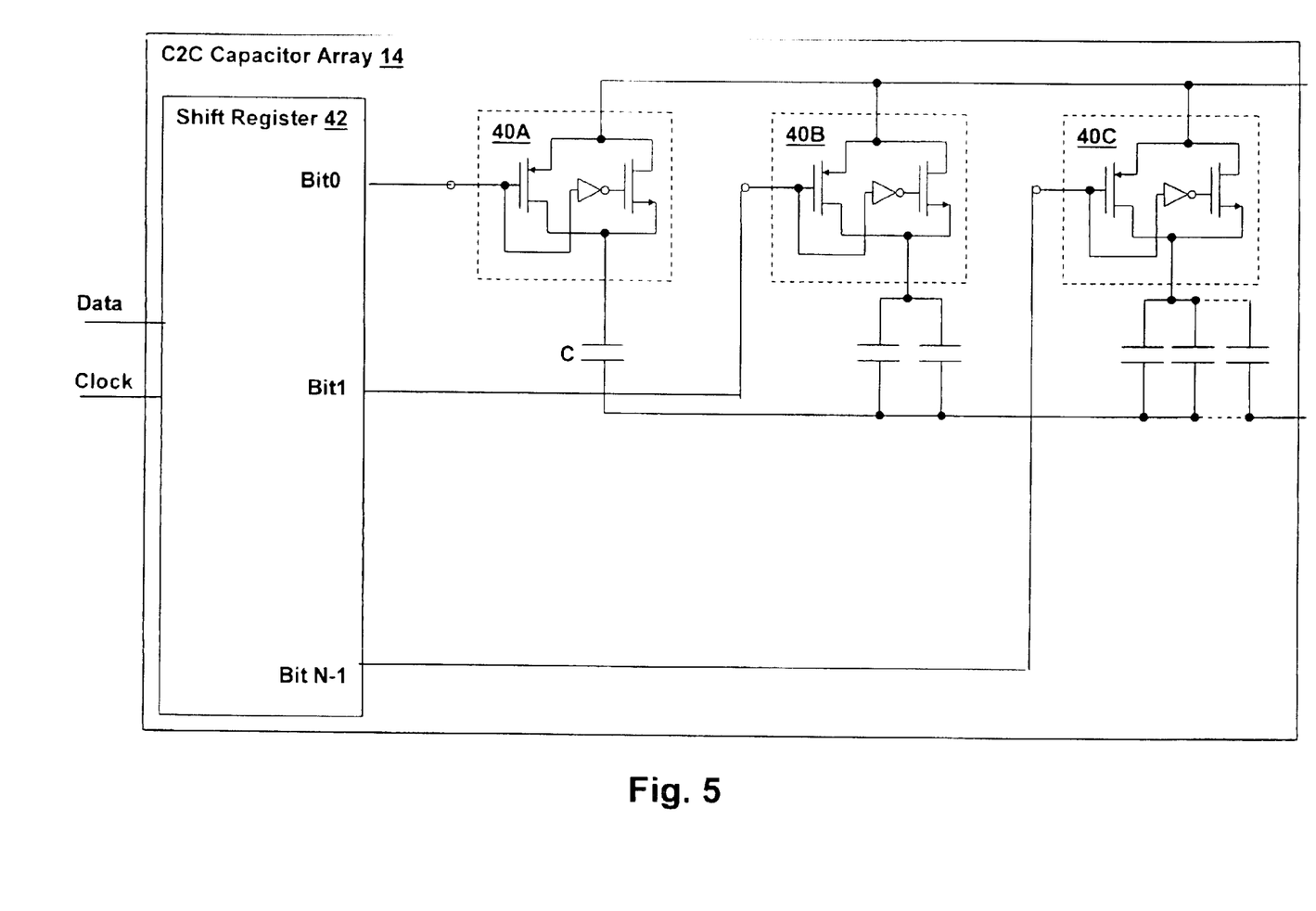
FIG. 5 is a schematic diagram depicting the C2C capacitor array 14 of FIG. 2.

Referring now to FIG. 5, details of C2C capacitor array of FIG. 2 are depicted. A shift register 42 receives a data and a clock signal whereby values may be loaded from memory 12 of FIG. 2. Individual bits clocked into shift register 32 control transmission gates 40A–40C to couple capacitors corresponding to values needed to form the programmed capacitance value. Since the number of capacitors coupled to the transmission gates 40A–40C increased in a power-of-two sequence within C2C capacitor array 14, any value may be programmed up to $C''(2^{(N+1)}-1)$, yielding N bits of capacitance resolution. The dashed line connecting capacitors within C2C capacitor array depict that the number of capacitors used in a controller integrated circuit design may be determined by the resolution required for operation of the transition time control circuit within the range of laser drive parameters required. Additionally, the capacitance values within capacitor array 14 may be chosen in increments other than powers-of-two, for example, a greater resolution may be around the lower end of the capacitance scale by including more precision near the least significant bit (LSB).

Figure 6:
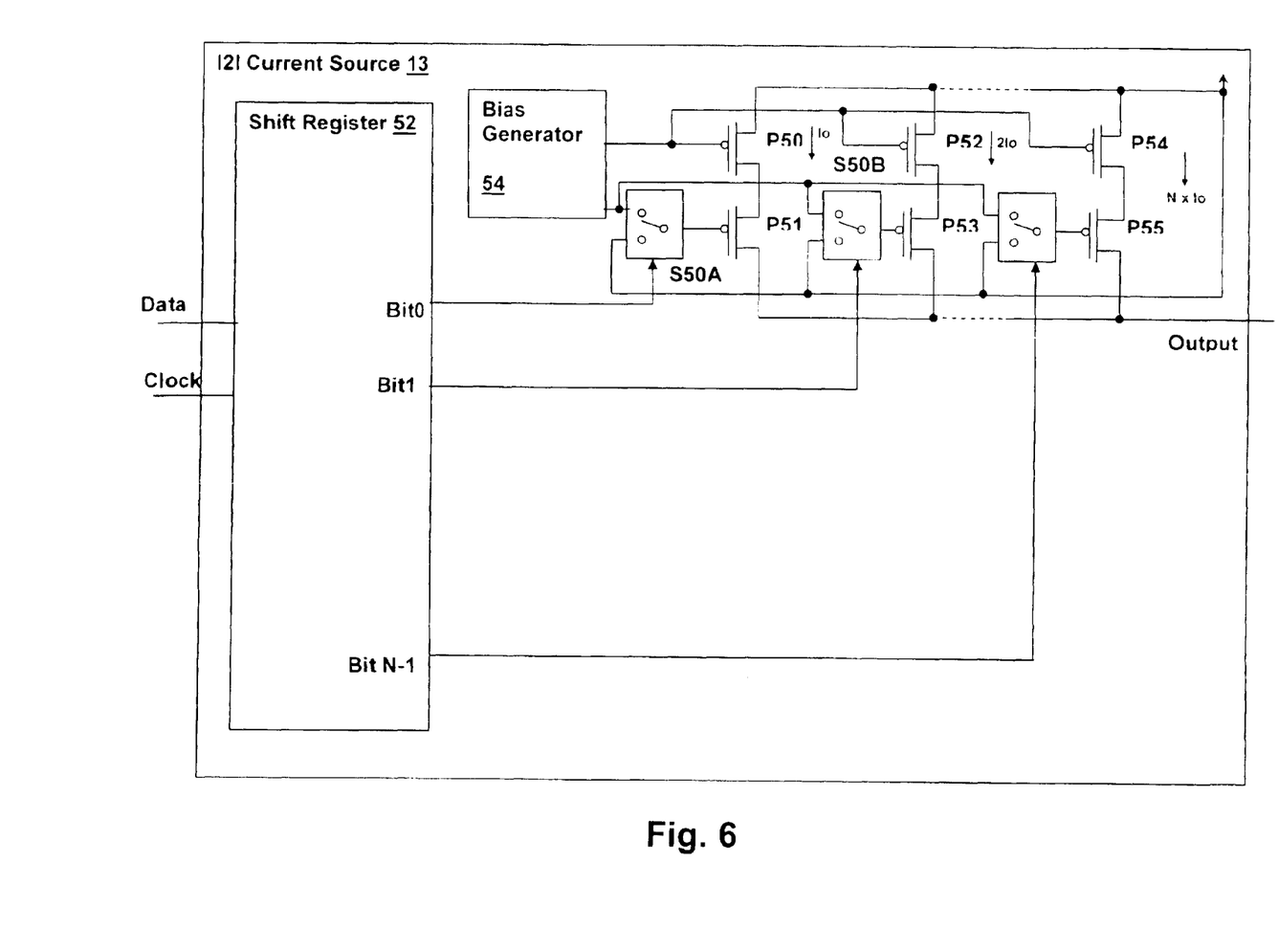
FIG. 6 is a schematic diagram depicting the I2I current source 13 of FIG. 2.

Referring now to FIG. 6, details of I2I current source 13 of FIG. 2 are depicted. A shift register 52 receives a data and a clock signal whereby values may be loaded from memory 12 of FIG. 2. Individual bits clocked into shift register 52 control switches S50A–S50C to couple the gates of switch transistors P51, P53 and P55 to a bias voltage produced by bias generator 54. When a switch is deselected, the gate of the associated transistor is coupled to the power supply rail and no current is switched through that transistor, effectively shutting of the current source. Bias generator 54 is a bias generator designed to provide a reference bias voltage to develop current through transistors P50, P52 and P54 and to provide a cascode voltage reference which when connected ensures that current sources & cascoded devices are properly in saturation over the entire range of operation. Current source transistors P50, P52, and P54 are sized to produce currents corresponding to values increasing in a power-of-two sequence and are coupled to the switch transistors P51, P53, and P55 connected in cascode so that when the bit for a particular current source is in the selected state (logic high), the corresponding cascode transistor is connected to its appropriate cascode bias voltage.

Since the values of the current sources coupled to the output within I2I current source 13 are set in powers of two, any value may be programmed up to $I_o''(2^N-1)$, yielding N bits of current resolution. The dashed line connecting current sources within I2I current source capacitor array depict that the number of current sources used in a controller integrated circuit design may be determined by the resolution required for operation of the modulation swing control circuit within the range of laser drive parameters required. Additionally, the current source values within current source 13 may be chosen in increments other than powers-of-two, for example, a greater resolution may be around the lower end of the bias current scale by including more precision near the least significant bit (LSB).

While the invention has been particularly shown and described with reference to the preferred embodiments thereof, it will be understood by those skilled in the art that the foregoing and other changes in form, and details may be made therein without departing from the spirit and scope of the invention.

What is claimed is:

1. A circuit for controlling a laser diode, comprising:
   a bias circuit coupled to said laser diode for setting a DC operating point of said laser diode;
   an amplifier having an output for superimposing an AC signal on said DC operating point, wherein said AC signal modulates an intensity of light emitted by said laser diode, and wherein said amplifier has a control input for controlling a maximum output swing of said amplifier;
   at least one capacitor connected in functional series between said output of said amplifier and a terminal of said laser diode, whereby said AC signal is capacitively coupled to said laser diode;
   a control circuit coupled to said control input for setting said maximum output swing; and
   a programmable memory coupled to said control circuit for storing values for controlling said maximum output swing, whereby an amplitude of said AC signal is controlled, thereby controlling said modulation independently from settings of said DC operating point.

2. The circuit of claim 1, wherein said programmable memory is a one-time-programmable memory.

3. The circuit of claim 1, wherein said programmable memory is an electrically-erasable memory.

4. The circuit of claim 1, wherein said control circuit comprises a current source coupled to said programmable memory and having an output coupled to said control input of said amplifier for providing control of said maximum output swing in response to settings within said programmable memory.

5. The circuit of claim 4, wherein said programmable memory is a analog memory, and wherein said current source comprises a voltage controlled current source having an input coupled to an output of said analog memory and an output coupled to said amplifier for controlling said maximum output swing.

6. The circuit of claim 4, wherein said current source comprises a digitally programmable current source.

7. The circuit of claim 6, wherein said digitally programmable current source comprises:
   a plurality of current sources having a fixed current scaled in sequence by powers of two; and
   a plurality of switches, wherein each of said plurality of switches is coupled to an associated one of said plurality of current sources, whereby a digital signal set coupled to control inputs of said plurality of switches sets a current level determined by a binary value of said digital signal set.

8. The circuit of claim 7, wherein said digitally programmable current source further comprises a shift register having a plurality of bit storage latches, wherein each of said plurality of latches is coupled to an associated one of said plurality of switches, whereby data from said programmable memory may be shifted in to control said plurality of switches to set said current level.

9. A circuit for controlling a laser diode, comprising:
a bias circuit coupled to said laser diode for setting a DC operating point of said laser diode;
a modulation signal source having an output for superimposing an AC signal on said DC operating point, thereby modulating an intensity of light emitted from said laser diode;
at least one capacitor connected in functional series between said output of said modulation source and a terminal of said laser diode, whereby said AC signal is capacitively coupled to said laser diode;
a programmable memory for storing values for controlling parameters of said circuit; and
means for controlling a maximum swing of said modulation signal source independently from settings of said DC operating point in conformity with said stored values.

10. The method of claim 9, wherein said modulating is performed via an amplifier having settable maximum and minimum output levels, and wherein said controlling sets said maximum and minimum output levels.

11. A method for operating a laser diode, comprising:
retrieving values stored in a programmable memory;
biasing said laser diode at a DC operating point;
modulating an intensity of said laser diode with a modulating signal from an amplifier, by passing said modulating signal through at least one capacitor connected in functional series between an output of said amplifier and a terminal of said laser diode; and
controlling a an amplitude of said modulating signal by controlling a maximum swing of said amplifier in conformity with said retrieved values.

12. A circuit for controlling a laser diode, comprising:
a bias circuit coupled to said laser diode for setting a DC operating point of said laser diode;
an amplifier having an output coupled to said laser diode for superimposing an AC signal on said DC operating point;
programmable memory for storing values for controlling a transition time of said AC signal; and
a control circuit for coupling said output of said amplifier to said laser diode, said control circuit having an ajustable response whereby a said transition time of said AC signal may be adjusted, and wherein said control circuit is further coupled to said programmable memory for adjusting said transition time in conformity with said values stored in said programmable memory, and wherein said control circuit is a capacitor array having a selectable capacitance for setting a coupling capacitance coupling said output of said amplifier to said laser diode, whereby said transition time is set in conformity with said selectable capacitance.

13. The circuit of claim 12, wherein said capacitor array comprises:
a plurality of capacitors having a capacitance scaled in sequence by powers of two; and
a plurality of switches, wherein each of said plurality of switches is coupled to an associated one of said plurality of capacitors, whereby a digital signal set coupled to control inputs of said plurality of switches sets a capacitance determined by a binary value of said digital signal set.

14. The circuit of claim 13, wherein said capacitor array further comprises a shift register having a plurality of bit storage latches, wherein each of said plurality of latches is coupled to an associated one of said plurality of switches, whereby data from said programmable memory may be shifted in to control said plurality of switches to set said capacitance.

15. The circuit of claim 12, wherein said amplifier has a control input for controlling maximum output swing of said amplifier, and wherein said programmable memory is further coupled to said control input for setting said maximum output swing.

16. The circuit of claim 15, further comprising a second control circuit coupled to said programmable memory and having an output coupled to said control input of said amplifier for providing control of said maximum output swing in response to settings within said programmable memory.

17. The circuit of claim 16, wherein said second control circuit comprises a programmable current source having an input for receiving at least one signal corresponding to said settings supplied from said programmable memory, whereby an output of said programmable current source provides a current level responsive to a value of said settings.

18. The circuit of claim 17, wherein said programmable current source comprises:
a plurality of current sources having a fixed current scaled in sequence by powers of two; and
a plurality of switches, wherein each of said plurality of switches is coupled to an associated one of said plurality of current sources, whereby a digital signal set coupled to control inputs of said plurality of switches sets a current level determined by a binary value of said digital signal set.

19. The circuit of claim 18, further comprising a shift register having a plurality of bit storage latches, wherein each of said plurality of latches is coupled to an associated one of said plurality of switches, whereby data from said programmable memory may be shifted in to control said plurality of switches to set said current level.

20. An integrated circuit for controlling a laser diode, wherein said integrated circuit comprises:
a bias control circuit for controlling a DC operating point of said laser diode;
a swing control circuit for controlling the maximum amplitude of an AC modulating signal via controlling the maximum swing of an external amplifier via an external terminal of said amplifier provided for controlling said external amplifier, whereby an output said amplifier when connected via an external at least one capacitor in functional series to a terminal of said laser diode superimposes an amplitude-controlled signal version of said AC modulating signal having an amplitude responsive to said swing control circuit; and
a programmable memory for supplying programmed values to said bias control circuit and said swing control circuit whereby said maximum amplitude and said DC operating point are independently set in conformity with said programmed values.

21. An integrated circuit for controlling a laser diode, wherein said integrated circuit comprises:
a bias control circuit for controlling a DC operating point of said laser diode;
a response control circuit for controlling the transition time of an AC modulating signal coupled to said laser diode;
a programmable memory for supplying programmed values to said bias control circuit and said response control circuit whereby said transition time and said DC operating point are set in conformity with said programmed values; and a swing control circuit for controlling a maximum swing of said AC modulating signal, and wherein said programmable memory is further used for supplying programmed values to said swing control circuit whereby said maximum swing of said modulating signal and said DC operating point are set in conformity with said programmed values; and an under-voltage lockout circuit for preventing operation of said bias control circuit unless a voltage supplied to said integrated circuit exceeds a predetermined level.

22. The integrated circuit of claim 21, wherein said bias control circuit comprises a bandgap reference for supplying a reference voltage for generating a laser bias voltage, and wherein said undervoltage lockout circuit disconnects an output of said bandgap reference unless a voltage from said bias control circuit exceeds a predetermined level.

23. The integrated circuit of claim 21, further comprising a power on reset circuit for preventing operation of said bias control circuit until an initialization time has elapsed.

24. The integrated circuit of claim 23, wherein said bias control circuit comprises a bandgap reference for supplying a reference voltage for generating a laser bias voltage, and wherein said power on reset circuit disconnects an output of said bandgap reference from said bias control circuit until said initialization time has elapsed.

25. The integrated circuit of claim 24, wherein a start of said initialization time is determined by the end of said under-voltage lockout circuit preventing operation.

26. The integrated circuit of claim 25, further comprising:
a logic AND gate for combining said output of said power on reset circuit and an output of said under-voltage lockout circuit; and
a buffer for coupling said output of said bandgap reference to said bias control circuit, said buffer having a control input for disabling said buffer, wherein said control input is coupled to an output of said logic AND gate for disconnecting said bias control circuit until a voltage supplied to said integrated circuit has reached a predetermined level and until said initialization time has elapsed.

27. A circuit for controlling a laser diode, comprising:
a bias circuit coupled to said laser diode for setting a DC operating point of said laser diode, said bias circuit having a power supply input coupled to a power supply rail;

a voltage reference coupled to said power supply rail for biasing a monitor diode optically coupled to said laser diode, such that variations in said power supply rail are not reflected in the bias imposed on said monitor diode, and wherein said voltage reference is further coupled to said bias circuit; and a programmable memory coupled to said bias circuit for setting said DC operating point; and an under-voltage lockout circuit;

a power-on reset circuit, wherein said under-voltage lockout circuit and said power-on reset circuit are coupled to said voltage reference for disabling said voltage reference until a voltage supplied to said integrated circuit has reached a predetermined level and an initialization time has elapsed.

28. The circuit of claim 27, wherein said programmable memory is a one-time-programmable memory.

29. The circuit of claim 27, wherein said programmable memory is an electrically erasable memory.

30. The circuit of claim 27, further comprising a bias resistor for coupling an output of said voltage reference to said monitor diode, whereby a gain of said bias circuit can be set by the value of said bias resistor.

31. The circuit of claim 27, wherein said bias circuit includes a resistor array having a selectable resistance value, wherein said resistance value is selectable via values stored within said programmable memory.

32. The circuit of claim 27, wherein said programmable memory is an analog memory and wherein said bias circuit further comprises a transistor having a gate coupled to an output of said analog memory for producing a resistance for controlling said bias circuit in conformity with values stored within said analog memory.

33. The circuit of claim 32, wherein said bias circuit further comprises a voltage controlled current source coupled to said monitor diode including a resistor having thermal resistance variation characteristics matched to thermal resistance variation characteristics of said programmable resistor array, whereby thermal variations in said resistor and said resistor array are cancelled.

* * * * *